United States Patent
Scheuerlein

(10) Patent No.: US 7,280,397 B2
(45) Date of Patent: Oct. 9, 2007

(54) THREE-DIMENSIONAL NON-VOLATILE SRAM INCORPORATING THIN-FILM DEVICE LAYER

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/179,360

(22) Filed: Jul. 11, 2005

(65) Prior Publication Data

US 2007/0008776 A1    Jan. 11, 2007

(51) Int. Cl.
*G11C 14/00* (2006.01)

(52) U.S. Cl. ............ 365/185.08; 365/154; 365/185.17; 365/225.7

(58) Field of Classification Search ................ 365/154, 365/185.08, 185.17, 225.7
See application file for complete search history.

(56) References Cited

U.S. PATENT DOCUMENTS

| | | | |
|---|---|---|---|
| 4,541,073 A | 9/1985 | Brice et al. | |
| 5,065,362 A * | 11/1991 | Herdt et al. | ................. 365/154 |
| 5,327,003 A | 7/1994 | Itabashi et al. | |
| 5,686,334 A | 11/1997 | Sundaresan | |
| 5,990,528 A | 11/1999 | Sundaresan | |
| 6,107,642 A | 8/2000 | Sundaresan | |
| 6,127,705 A | 10/2000 | Kim | |
| 6,414,873 B1 * | 7/2002 | Herdt | ................. 365/185.08 |
| 6,798,689 B2 | 9/2004 | Müller et al. | |
| 6,836,428 B2 * | 12/2004 | Nakura et al. | ............. 365/154 |
| 2005/0162896 A1 * | 7/2005 | Jung | ........................ 365/154 |

OTHER PUBLICATIONS

An, Hung-Jun, et al., "64Mb Mobile Stacked Single-crystal Si SRAM ($S^3$ RAM) with Selective Dual Pumping Scheme (SDPS) and Multi Cell Burn-in Scheme (MCBS) for High Density and Low Power SRAM," 2004 Symposium on VLSI Technology, Digest of Technical Papers, Jun. 17-19, 2004, pp. 282-283.

Jang, J. H., et al., "Novel 3-Dimensional $46F^2$ SRAM Technology with $0.294\mu m^2$ $S^3$ (Stacked Single-crystal Si) Cell and SSTFT (Stacked Single-crystal Thin Film Transistor)," Proceedings of the $34^{th}$ European Solid-State Device Research Conference (ESSDERC), Sep. 21-23, 2004, pp. 445-448.

(Continued)

*Primary Examiner*—Hoai V. Ho
(74) *Attorney, Agent, or Firm*—Zagorin O'Brien Graham LLP

(57) ABSTRACT

A shadow RAM or "non-volatile SRAM" memory cell is implemented in a much smaller area by building the cell upward rather than outward. By stacking non-volatile storage devices above or below an SRAM cell, a smaller cell can be provided and result in a lower cost memory device. In certain embodiments, such a memory cell includes a pair of cross-coupled devices disposed on a first device layer and defining a pair of internal cross-coupled nodes, and a pair of non-volatile storage devices disposed on a second device layer above or below the pair of cross-coupled devices and coupled to the cross-coupled nodes.

32 Claims, 4 Drawing Sheets

OTHER PUBLICATIONS

Jung, Soon-Moon, et al., "Highly Area Efficient and Cost Effective Double Stacked $S^3$ (Stacked Single-crystal Si) Peripheral CMOS SSTFT and SRAM Cell Technology for 512M bit density SRAM," 2004 International Electron Devices Meeting, Technical Digest 04.1 (2004 Technical Degest), pp. 265-268.

Jung, Soon-Moon, et al., "The Revolutionary and Truly 3-Dimensional $25F^2$ SRAM Technology With the Smallest $S^3$ (Stacked Single-crystal Si) Cell, $0.16\mu m^2$, and SSTFT (Stacked Single-crystal Thin Film Transistor) for Ultra High Density SRAM," 2004 Symposium on VLSI Technology, Digest of Technical Papers, Jun. 15-17, 2004, pp. 228-229.

Kang, Y. H., et al., "Fabrication and Characteristics of Novel Load PMOS SSTFT (Stacked Single-crystal Thin Film Transistor) for 3-Dimensional SRAM Memory Cell," 2004 IEEE International SOI Conference, Oct. 4-7, 2004, pp. 127-129.

Liu, C. C. and Tiwari, S., "Application of 3D CMOS Technology to SRAMS," 2002 IEEE International SOI Conference, Oct. 7-10, 2002, pp. 68-70.

Masouka, F., et al., "New Three Dimensional (3D) Memory Array Architecture for Future Ultra High Density DRAM (invited)," Proceedings of the Fourth IEEE International Caracas Conference on Devices, Circuits and Systems, Oct. 17-19, 2002, pp. C015-1-C015-6.

Simtek Corporation, "Quantum Trap™ nvSRAM Technology," © 1999, pp. 1-5, downloaded from http://www.simtek.com/Technology/SimtekQuantumTrap.pdf.

* cited by examiner

THREE-DIMENSIONAL NON-VOLATILE SRAM INCORPORATING THIN-FILM DEVICE LAYER

BACKGROUND

1. Field of the Invention

The present invention relates to read/write semiconductor memory devices, and particularly to such devices including both volatile and non-volatile data storage within each memory cell and which are sometimes referred to as shadow RAMs.

2. Description of the Related Art

The design and configuration of semiconductor memory devices frequently must make trade-offs in area, performance, power dissipation, environmental requirements, and volatility. Some memory technologies are high performance, but are volatile (e.g., lose data when powered off), while other technologies are non-volatile but lower in performance. Some non-volatile memory technologies also have limitations on the number of program/erase cycles that may be performed, which limits their suitability for certain applications.

To achieve a high performance non-volatile memory, batteries have sometimes been incorporated into the packaging of otherwise volatile semiconductor memory devices, or included in the system design for such memory device. This adds cost, risks such batteries being discharged too quickly when needed, and may also negatively impact overall reliability.

Another structure for achieving a high performance yet non-volatile memory device combines a high performance volatile memory cell, such as a static random access memory (SRAM) cell with a non-volatile memory cell. The volatile portion of the memory cell may be written and read in the usual manner without limitations as to number of "write" cycles, and the written data may be stored within the non-volatile portion of the cell, such as when power is about to be removed. Subsequently, such stored data may be recalled into the SRAM portion when desirable. Such store and recall operations are frequently carried out for many memory cells simultaneously.

Such combination memory cells are sometimes called "shadow RAM" cells, the implementation of which includes both a fully functional SRAM cell as well as programmable non-volatile data storage elements. Consequently, such memory cells historically are larger than either constituent portion would be alone.

SUMMARY

A shadow RAM or "non-volatile SRAM" memory cell may be implemented in a much smaller area by building the cell upward rather than outward. For example, by stacking thin film non-volatile storage devices on top of an SRAM cell largely formed on the semiconductor substrate, a smaller cell can be provided and result in a lower cost memory device.

In a broader sense, such a memory cell may include a pair of cross-coupled devices disposed on a first device layer and defining a pair of internal cross-coupled nodes, and a pair of non-volatile storage devices disposed on a second device layer above or below the pair of cross-coupled devices and coupled to the cross-coupled nodes.

One of the first or second device layers may include a semiconductor substrate device layer, although such is not necessarily required, as in some embodiments both device layers may be implemented on device layers formed above the semiconductor substrate. In certain preferred embodiments, the non-volatile storage may be provided by a pair of TFT SONOS devices, such as within a NAND string, although other non-volatile storage devices are contemplated, including passive element devices (e.g., fuses, antifuses) and organic devices. Both one-time-programmable devices and write-many programmable devices are contemplated for various embodiments.

In certain embodiments, each memory cell may include sufficient non-volatile storage devices to store two or more data states, each of which may be recalled into the SRAM portion of the memory cell. For example, a second pair of non-volatile storage devices may be disposed on a device layer above or below the pair of cross-coupled devices and coupled to the cross-coupled nodes. Such a second pair may be disposed on the same device layer as the first pair of non-volatile storage devices (e.g., within the same NAND strings), or may be disposed on a third device layer separate from the first and second device layers.

In certain embodiments, each memory cell also includes a pair of load devices formed on the second device layer (or alternatively, on another device layer) and respectively coupled to the pair of cross-coupled internal nodes. Such load devices may include resistors formed in a thin film device layer.

Word line access transistors may be implemented on a separate device layer, or may be implemented along with other structures on another one of the aforementioned device layers. In some embodiments, an exemplary memory cell includes four device layers respectively including cross-coupled driver devices, word line access devices, load devices, and non-volatile storage devices, although by no means necessarily in that relative order. Vertical via structures or "zias" are preferably utilized to connect together the devices disposed on separate device layers to form the memory cell.

The invention in several aspects is particularly suitable for implementation within an integrated circuit, including those integrated circuits having a memory array, for memory array structures, for memory cell structures, for methods for operating such integrated circuits, memory cells, and memory arrays, and for computer readable media encodings of such integrated circuits, memory cells and memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
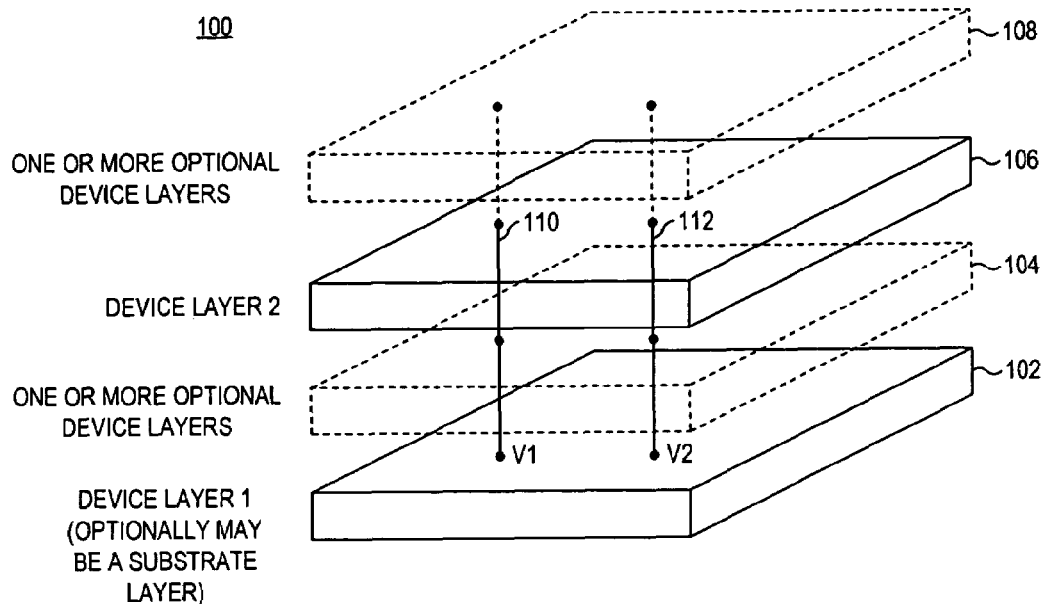
FIG. 1 depicts a structural arrangement of two or more device layers useful for implementing memory cells in accordance with the present invention.

Referring now to FIG. 1, a structural representation is shown of a non-volatile memory cell 100 which includes a device layer 102 and at least a second device layer 106. One or more optional layers 104 may be disposed between device layer 102 and device layer 106, and one or more optional-device layers 108 may be disposed above device layer 106. Such a memory cell is suitable for fabrication in a monolithic integrated circuit. One of the device layers, such as device layer 102, may be a substrate layer, such as a semiconductor substrate device layer (e.g., one or more layers and features useful for forming a traditional silicon gate transistor upon a semiconductor substrate), although such is not required. Such device layers may also be formed of a thin film semiconductor layer, within which may be formed transistors, resistors, or other useful components. Informally, such a layer may be referred to as a TFT layer (i.e., "thin film transistor" layer) even though such a layer may or may not include actual transistors, and may include components other than transistors.

An exemplary memory cell implementation includes portions implemented on a first device layer, such as device layer 102, and other portions implemented on a second device layer, such as device layer 106. Internal nodes 110 and 112 connect various components of the memory cell together, as described in greater detail below. In one exemplary embodiment, the non-volatile memory cell 100 includes a four-transistor static RAM cell on device layer 102, and a non-volatile memory structure on device layer 106. The four-transistor static memory cell (i.e., 4T RAM cell) includes a pair of cross-coupled N-channel MOS transistors 122, 124, defining a pair of cross-coupled internal nodes (also labeled 110, 112), and further includes a pair of word line access transistors 126, 128 which respectively couple the cross-coupled internal nodes to a true and complement bit line pair, BLT and BLC.

In this exemplary embodiment the device layer 106 includes a pair of load devices 132, 134 for the 4T memory cell, which load devices are coupled to a read/write bias line 130 which conveys a READ/WRITE "VDD" voltage for the memory cell. Also, the device layer 106 includes non-volatile storage devices which can be programmed in accordance with the data written into the SRAM cell, and programmed data recalled into the SRAM cell. A pair of series-connected NAND strings are shown, each including a single data storage device disposed between a respective pair of select transistors, and each coupled at one end to a respective one of the cross-coupled internal nodes, and coupled at the other end to a program bias line. For example, the NAND string coupled to node 110 ("V1") includes a select transistor 138 (responsive to a SELECT1 signal), a data storage transistor 137 (responsive to a PROGRAM signal), and a select transistor 136 (responsive to a SELECT2 signal). The far end of the NAND string (i.e., opposite the V1 node) is coupled to a PROGRAM BIAS line 140. Likewise, the NAND string coupled to node 112 ("V2") includes a select transistor 144 (responsive to the SELECT1 signal), a data storage transistor 143 (responsive to the PROGRAM signal), and a select transistor 142 (responsive to the SELECT2 signal), and the far end of which is coupled to the PROGRAM BIAS line 140.

In the exemplary embodiment depicted, the data storage devices 137, 143 are thin film devices having a charge storage dielectric, and preferably are SONOS devices (i.e., literally, devices having a "silicon/silicon dioxide/silicon nitride/silicon dioxide/silicon" structure forming the gate oxide, but here referring to any device having a silicon nitride dielectric layer having a charge storage characteristic).

Thus, the exemplary NV RAM cell (also known as a "shadow RAM" cell) places the non-volatile data storage portion of the cell on a different device layer to allow its placement above the 4T SRAM cell portion, rather than requiring the entire memory cell to be implemented on a single device layer. As a result, this three-dimensional memory cell requires far less area than if implemented on a single device layer, perhaps by as much as one-third less area.

Figure 3:
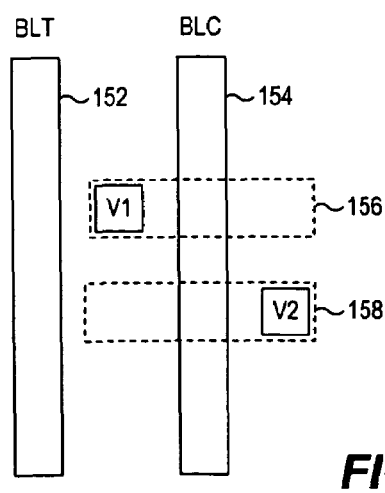
FIG. 3 depicts an exemplary layout arrangement a pair of bit lines useful for the memory cell represented in FIG. 2.

In certain exemplary embodiments, the word line may be formed, at least in part, by a gate material for the two word line access transistors 126, 128. The bit lines BLT, BLC may be routed on a wiring layer between device layers 102 and 106 (i.e., "above" the cross-coupled devices 122, 124 and below the TFT devices). The cross-coupled internal nodes 110, 112 include vertical connections between such device layers, here shown as vias V1 and V2. As depicted in FIG. 3, such vias may be located and arranged to bypass bit lines BLT, BLC on a bit line wiring layer in order to reduce the area required for such vias and bit lines, as is more fully described in "High Density Contact to Relaxed Geometry Layers" by Roy E. Scheuerlein, et al., U.S. application Ser. No. 10/728,451 filed Dec. 5, 2003, which application is hereby incorporated by reference in its entirety. The conductive features 156, 158 represent wiring which forms a portion of the cross-coupled internal nodes, which features 156, 158 may be polysilicon, metal, metal alloy, or other suitable conductive material, and preferably are formed within the device layer 102 or are disposed between device layer 102 and the bit line wiring layer.

The TFT load devices 132, 134 for the SRAM cell are also formed on the same device layer 106 as the TFT SONOS data storage devices. The memory cell operates as a traditional TFT load type SRAM cell (also sometimes called a "Poly-R load" cell) when non-volatile data is not being stored or recalled. During such normal read/write SRAM operation, the SELECT1 line is low to shut off the path through the select devices 138, 144, and thus through the non-volatile storage devices 137, 143.

Figure 5:
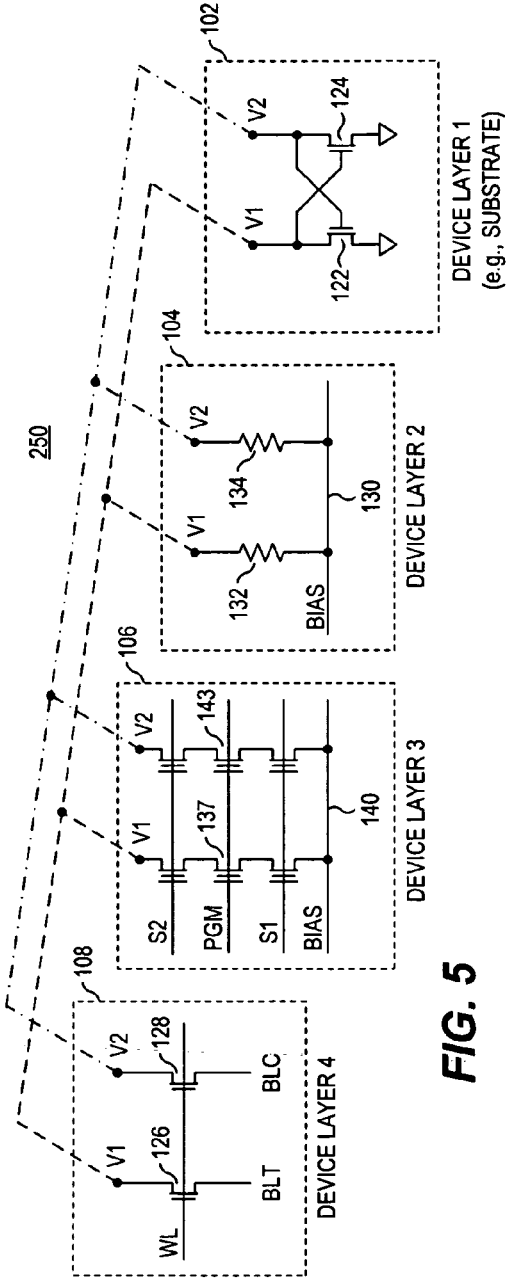
FIG. 5 is a schematic diagram of an exemplary memory cell having portions implemented on each of four device layers.

An even smaller cell shown in FIG. 5 is formed by adding two more layers of TFT so the cell has 1) cross coupled NMOS on the substrate, 2) TFT load layer, 3) NV device layer, and 4) WL access devices stacked one on top of the other. The bit lines are formed in a routing layer above all the device layers.

Figure 4:
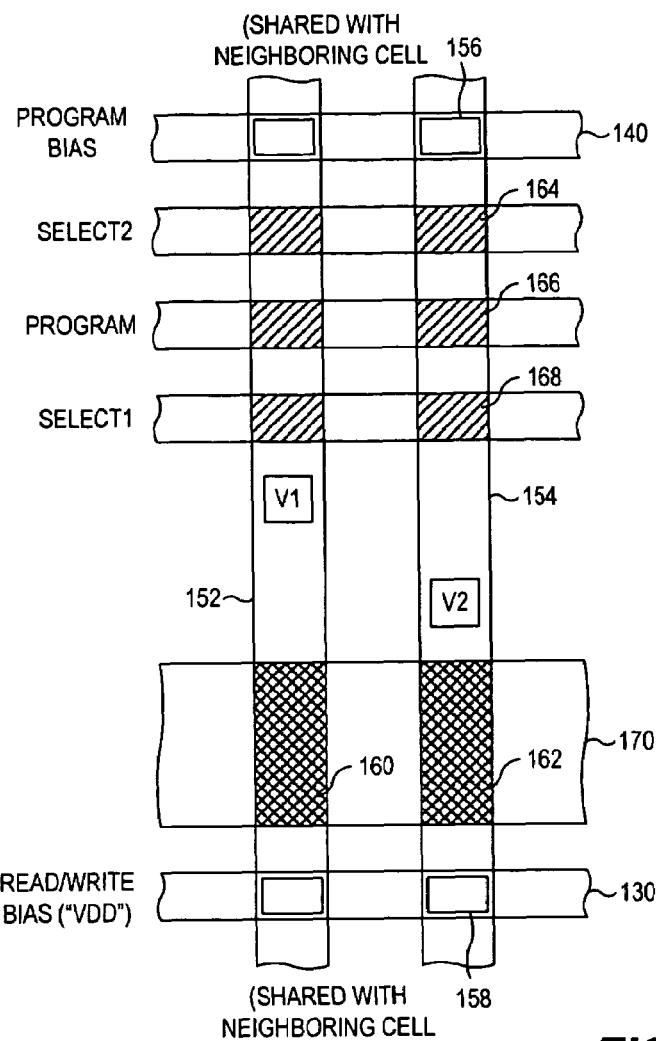
FIG. 4 depicts an exemplary layout arrangement of one device layer represented in FIG. 2.

Such an exemplary NV SRAM cell may be fabricated using a traditional CMOS process with the addition of several other masking layers. In certain embodiments incorporating two device layers, four such mask layers may be added. Referring now to FIG. 4, an exemplary layout is depicted of the TFT devices on device layer 106. An exemplary process flow is next described in regards to this layout.

A channel mask may be used to define a pair of thin film channels 152, 154. Such channels, and the formation of TFT SONOS transistors configured in a series-connected NAND string are more fully described in "Programmable Memory Array Structure Incorporating Series-Connected Transistor Strings and Methods for Fabrication and Operation of Same" by Roy E. Scheuerlein, et al., U.S. application Ser. No. 10/335,078 filed Dec. 31, 2002, which application is hereby incorporated by reference in its entirety, and in "NAND Memory Array Incorporating Capacitance Boosting of Channel Regions in Unselected Memory Cells and Method for Operation of Same" by En-Hsing Chen, et al., U.S. Patent Application Publication No. US 2004/0145024, which application is hereby incorporated by reference in its entirety.

The high resistance load devices 132, 134 (i.e., the poly loads) may be defined by one mask, for example a blocking mask (not shown) that leaves the channel stripes 152, 154 un-doped in the regions 160, 162 forming the load devices. A gate mask may be used to define the SELECT1, PROGRAM, and SELECT2 lines, as well as the PROGRAM BIAS line 140, and the read/write bias line 130. This gate mask is used with an ONO dielectric to form the SONOS devices, and may also be used to block the source/drain implant and salicide formation from the portion of the channel stripes 152, 154, thus maintaining the load device regions 160, 162 as high resistance portions of the channel stripes, as well as define the gates of the SONOS devices 164, 166, 168. The feature 170 is such a gate mask feature used to block the source/drain and salicide formation within the load device regions 160, 162. Contacts 156, 158 connect the channel strip 154 to the program bias line 140 and the read/write bias line 130, respectively. While not shown in the figure, high voltage transistors may be implemented in the support circuitry for such a memory array, including decoders and drivers for the select and program lines, as well as the program bias line.

As described above, in certain exemplary embodiments, two wiring layers may be utilized between the cross-coupled device layer (e.g., device layer 102) and the TFT device layer (e.g., device layer 106). The bit lines BLT, BLC are routed on one such wiring layer (e.g., the upper layer of such two layers, also referred to herein as an R2 layer), and the cross-coupling connections on the other such wiring layer (e.g., the lower layer of such two layers, also referred to herein as an R1 layer). The V1 via may be arranged to contact all the front end layers (i.e., the TFT channel, the R1 layer, and one or more conductive layers in the device layer 102). The V2 via could provide connection between the TFT channel layer to R1. It may also be desirable to provide another connection layer (a so-called TM distribution level) above the TFT device layer, with a third via for connections to lower conductor layers.

The V1 (and optionally the V2) vias are preferably fabricated as a single structure for contacting conductive features on three or more layers within a semiconductor process. Such vias may be called "chimney zias." Suitable methods for their formation is described in the aforementioned U.S. application Ser. No. 10/728,451.

The configuration of the SONOS devices in such a NV RAM cell significantly reduces the requirements on the SONOS device in regards to read disturb, program disturb, and number of program cycles which may be achieved. For example, when reading or writing the SRAM cell the SONOS devices are totally disconnected, and thus do not suffer any SRAM read or write disturb effects.

The store operation of previously written SRAM data into the SONOS cell involves an erase of both SONOS data storage devices followed by a program operation for one of the SONOS data storage devices and an inhibit operation for the other SONOS data storage device. The erase and program operations can be implemented as very slow operations, as the critical access time for the normal SRAM cell is independent of these operations. In some embodiments, the store and recall operations may be carried out while the integrated circuit device remains powered up, but in other applications, the store operation may be carried out after power has been removed (e.g., such as in a power failure or after powering down a system containing such a device). A large capacitor may be used to maintain sufficient voltage on the supply power lead after a power down condition is detected, and the capacitor size determined as required for the length of time necessary to fully store the data in the SRAM cells into their respective "shadow" non-volatile memory cells. The threshold window (i.e., $V_T$ window, being the threshold difference between a "programmed" device and an "erased" device) is preferably achieved by using a saturated erase, followed by a long program cycle. In other words, using an erase bias that is long enough to shift the device threshold voltage to an erased value which is relatively unchanged by additional erase time, then using a long program cycle to shift the threshold to a programmed value which is sufficiently different than the erased value to result in a reliable threshold window. Since a program/verify operation is somewhat difficult to perform in a shadow RAM architecture, the saturated erase and long program cycle can be used to provide a reliable threshold window. Sort testing and redundancy may also be used to eliminate weak cells.

Unlike a larger NAND string memory array, the threshold window for a three-transistor NAND string (i.e., including a single data storage device between two block select devices) is not degraded by program disturb conditions. There is no "F cell" disturb, as each NAND string includes only one data storage device (i.e., there are no other devices whose "word line" is not selected in a "selected" NAND string during programming). Moreover, there is no "U cell" disturb, as there are no unselected NAND strings having unselected memory cells during programming. In addition, as mentioned above, there is little read disturb because the NAND strings are decoupled from the SRAM cell during normal operation, and because the recall operations are performed infrequently. Consequently, the threshold window may be less than for other NAND string memory arrays having greater disturb conditions, and still provide sufficient noise margin for reliable store and recall operation.

Figure 2:
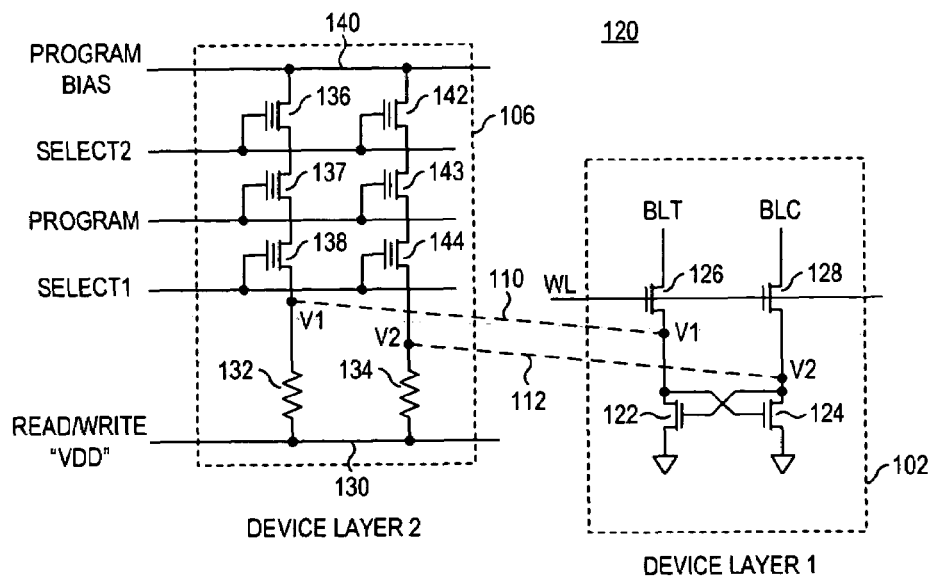
FIG. 2 is a schematic diagram of an exemplary memory cell having portions implemented on each of two device layers.

An exemplary erase operation may be performed while the Program Bias line is at Ground, the SELECT2 line is high enough to turn on the top select device, and then the Program line is driven to a negative voltage of sufficient magnitude and duration to erase the memory device. Referring to FIG. 2, an exemplary program operation is performed by first raising SELECT2 to pass a program inhibit voltage to the drain and source of device 143 and 137. Then SELECT2 is brought to ground. The drain and source of device 137 may rise, but then falls to ground when SELECT1 is pulled to an intermediate voltage of approximately the Read/Write "VDD" voltage plus a threshold voltage. Node 110 is held at ground by device 122 as the PROGRAM line is raised to a programming voltage and held for a duration sufficient to change the threshold voltage of device 137 by about two volts. The drain and source of device 143 is coupled higher with the rising PROGRAM line, and device 144 is off (or leaks only slowly) so device 143 is inhibited from the program operation.

When storing data, all memory cells coupled to a given PGM line (also called PROGRAM in some figures) are programmed at the same time, and after all such cells have been erased. In each such memory cell, one of the non-volatile devices is programmed, while the other is "inhibited" from programming. Thus, the erased device only is exposed to a single programming cycle. This is in contrast to a large NAND string array having many memory cells in each NAND string, in which an erased device is potentially exposed to many programming cycles that might disturb the erased state. Channel self-boosting may be utilized for improving the inhibit bias for the NAND string, and multiple programming pulse techniques may be utilized to help provide adequate protection of the inhibit bias. In addition, multiple isolation devices may also be utilized to help provide adequate protection of the inhibit bias. In other word, two select devices may be employed at one or both ends of a single memory cell NAND string, resulting in four or five total devices in such a "single memory cell" string. These techniques are described in greater detail in "NAND Memory Array Incorporating Capacitance Boosting of Channel Regions in Unselected Memory Cells and Method for Operation of Same" by En-Hsing Chen, et al., U.S. Patent Application Publication No. US 2004/0145024, which application is hereby incorporated by reference in its entirety.

The operation of exemplary TFT SONOS NAND memory arrays are described in "Integrated Circuit Including Memory Array Incorporating Multiple Types of NAND String Structures" by Luca G. Fasoli and Roy E. Scheuerlein, U.S. application Ser. No. 11/026,492 filed on Dec. 30, 2004, which application is hereby incorporated by reference in its entirety. In addition, the reduction of read disturb and program disturb effects are described therein when such NAND strings include only one memory cell disposed between two select devices. Further, the operation of such NAND string memory arrays are described therein in which the select devices are themselves SONOS devices, even though not utilized to store data therein.

During a recall operation, the cross-coupled nodes are both pulled to ground by raising the word line with the bit lines BLT, BLC held low. The read/write bias node for the TFT load devices (e.g., the "VDD" for normal SRAM operation) is also held low. Then the PROGRAM line is driven high, and the SONOS device having the lower threshold provides a pull-up current that is dominant over any current through the TFT load device, and thus drives one of the internal cross-coupled nodes high, while the other cross-coupled node remains low. While the SRAM "VDD" node for the TFT load devices can be driven to ground during a recall operation, preferably it is reduced to about 1 threshold voltage (i.e., the $V_T$ corresponding to the NMOS cross-coupled SRAM cell devices 122, 124) during the recall operation to minimize current through the TFT load device, thus reducing the requirements for on-current of the NAND string.

Here, when data is recalled from the SONOS devices into the SRAM memory cell, such a recall operation is a "read" of the SONOS device. This recall produces far less "read disturb" than an large array configuration because one of the cell node 110, 112 rises for the SONOS low threshold case, reducing positive gate bias on the SONOS device, and reducing the tendency for the SONOS threshold to rise. On the other side of the memory cell, the SONOS device has a high threshold, and the associated internal cross-coupled cell node stays low. The continuing higher gate bias as the PROGRAM line rises tends to reinforce the stored high threshold state (i.e., the "erased" state). Preferably, the choice for the two data states of the SONOS devices are plus and minus 2 volts. With such choices, both data states are reinforced, and neither state is significantly "disturbed" by the recall operation. In addition, being a shadow RAM, the number of times a recall is performed is much reduced compared to the number of SRAM read cycles.

During a recall operation, the on-current for the NAND string which includes the low threshold SONOS device only has to be greater than the TFT load device current (to overpower the load device and pull the internal node above a NMOS threshold voltage). The NAND string on-current is also likely to be higher than a large array NAND configuration because here each NAND string only includes three (or maybe up to, for example, five) devices, and also drives a very small capacitance of one of the two memory cell internal nodes, rather than having to drive a large global bit line. The threshold window is less demanding because the recall operation relies on a difference in threshold voltage between two adjacent strings and has the advantage of twin cell doubling the signal and noise rejection due to close proximity and minimal node capacitance. Such twin cell operation is described in greater detail in "Multiple Twin-Cell Non-Volatile Memory Array and Logic Block Structure and Method Therefor" by Roy E. Scheuerlein, et al., U.S. application Ser. No. 10/675,212 filed Sep. 30, 2003, which application is hereby incorporated by reference in its entirety.

In another exemplary embodiment, a memory cell may be implemented without separate TFT load resistors or devices. Instead, the non-volatile storage devices are biased with at least one of the devices off, and field enhanced leakage current through the off TFT device provides current for operation of the SRAM cell. In an exemplary configuration, the middle device of the NAND string is on with a gate voltage high enough that both of the internal cross coupled nodes have sufficient "load" current to remain stable.

In some embodiments an antifuse is used as a passive element device in a cell arrangement analogous to FIG. 2. The Select2 and Program Bias connections are not required. The Select1 line controls the gate of a select device which does not contain a charge storage dielectric. The drain region of the select device is extended under a program line. A silicon dioxide antifuse layer is formed between the extended drain region and the program line. The vertical antifuse structure comprises a thin deposited semiconductor film, a silicon dioxide antifuse layer, and a conductor layer forming the top electrode and the program line. A silicon or germanium semiconductor film may be used, and dielectric layers other than silicon dioxide may also be used for the antifuse. Preferably the antifuse shares some layers with the select device 138. After formation of a thin film device layer, a gate oxide is formed on the thin film device layer. Then a mask is used to define the portion of the device layer extending from the drain of transistor 138 where an antifuse is desired. An n-type dopant such as arsenic is implanted into the thin film device layer, the photoresist is removed, and a silicon dioxide antifuse layer is formed to a thickness of about 15 Angstroms. Then a conductive layer such as salicided polysilicon is deposited and patterned to form the gate of the device 138 and a top electrode of the antifuse, and portions of control lines Program and Select1. Data is transferred from the node V1 and V2 to the state of the antifuse by holding Select1 at an intermediate voltage to limit the highest voltage that passes to nodes V1 and V2. If, for example, V1 is being held at ground by device 122, the extended drain region of device 138 will also be held at ground. The voltage on Program is slowly raised to about 8 volts over several microseconds. The voltage stress will break down the antifuse connected to the drain of device 138. A second antifuse connected to the drain of device 144 leaks due to tunneling currents that are about 100 pA at about 2 volts bias across the antifuse. Device 124 is off and the leakage current raises node V2 and the drain of device 144 so the voltage stress on the second antifuse is less than four volts. The second antifuse does not breakdown, and further may have a lifetime of many milliseconds at a stress voltages below 4 volts.

To transfer data from the non-volatile state of the first and second antifuses, first discharge nodes V1 and V2, hold the Select1 line at an intermediate voltage, and drive the Program line to the Read Vdd level so the antifuse elements act as load resistors. The first antifuse conducts more current than the second antifuse, so node V1 rises to turn on device 124 which holds node V2 low. Read/Write Vdd is then raised and Select1 is brought to ground to compete the transfer to normal SRAM operation. With more complex processing a diode plus antifuse can be formed under the Program line. Any suitable diode antifuse cell such as those described in the various disclosures incorporated herein can be incorporated. In this case there can be multiple diode antifuse memory elements on the extended drain of devices 138 and 144, each associated with a Program line to store and recall multiple non-volatile memory state data. Any other passive element cell could be substituted for the antifuse passive element.

In some embodiments, more than two device layers may be utilized to result in a memory cell having an even smaller area. Referring now to FIG. 5, a schematic diagram is depicted of an exemplary memory cell having portions implemented on each of four device layers. The cross-coupled NMOS transistors forming part of the 4T memory cell are still disposed on the first device layer 102, but the word line access transistors 126, 128 are now disposed on a fourth device layer 108. The load devices 132, 134 for the 4T cell remain on the second device layer 104, but the non-volatile storage devices 137, 143 are now disposed on a third device layer 106. As before, a vertical via or "zia" connects the four nodes labeled V1 on each of the four device layers, and a second zia similarly connects the four nodes labeled V2 on each of the device layers, as represented by dotted lines.

Figure 6:
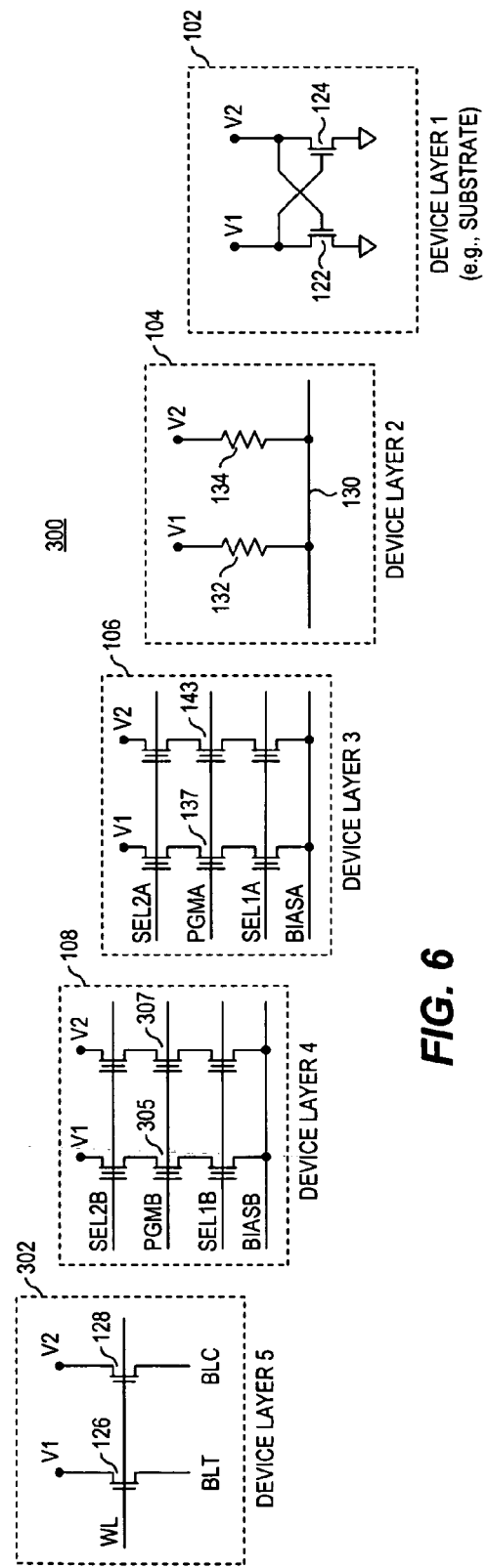
FIG. 6 is a schematic diagram of an exemplary memory cell having portions implemented on each of five device layers, including two programmable data bits for such memory cell.

In various embodiments, more than one bit of information may be stored behind each SRAM cell, and each selectively recalled into the SRAM cell. For example, FIG. 6 is a schematic diagram of an exemplary memory cell having portions implemented on each of five device layers, including two programmable data bits for such memory cell. In this embodiment, the word line access devices are again disposed on the upper-most device layer, although in other embodiments such is not required. The cross-coupled devices 122, 124 and the load devices 132, 134 are again disposed respectively on the first and second device layers 102, 104, although in other embodiments such is not required. A second pair of non-volatile storage devices 305, 307 is disposed on the fourth device layer 108, along with the first pair of storage devices 137, 143 disposed on the third device layer 106. Each non-volatile storage layer 106, 108 includes an independently controllable NAND string with separate select devices at both ends of each NAND string, and a separate bias line for each layer. For example, device layer 106 includes select lines SEL1A, SEL2A, a program line PGMA (i.e., analogous to a word line in a traditional large array environment), and a program bias line BIASA, while device layer 108 includes select lines SEL1B, SEL2B, a program line PGMB, and a program bias line BIASB. As before, the V1 and V2 nodes on each device layer are preferably connected respectively together by a respective zia.

Figure 7:
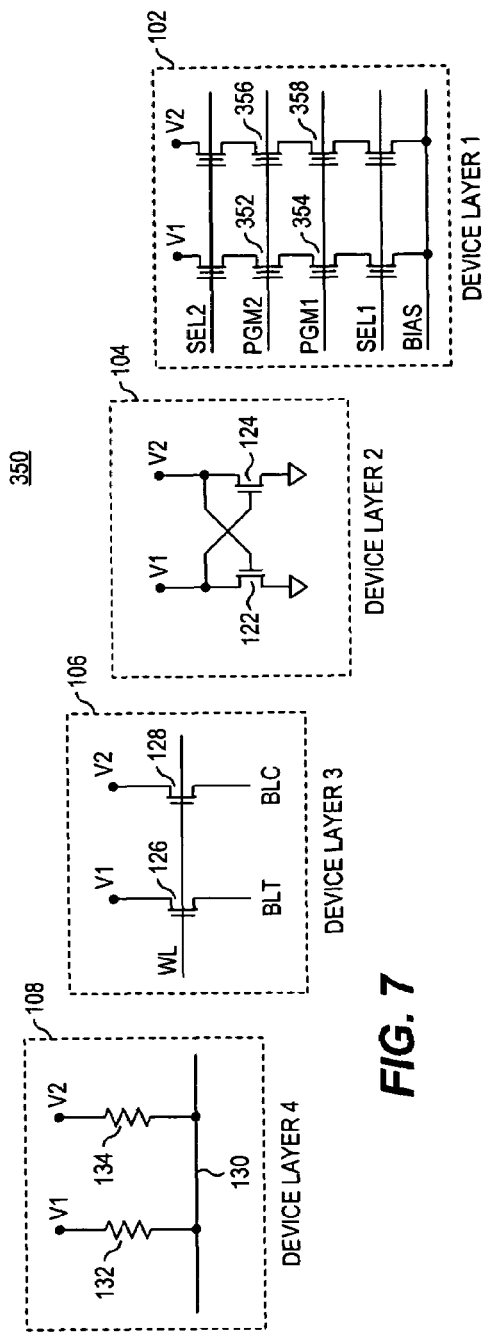
FIG. 7 is a schematic diagram of another exemplary memory cell having portions implemented on each of four device layers.

FIG. 7 is a schematic diagram of another exemplary memory cell having portions implemented on each of four device layers, and which also provide two non-volatile storage locations behind each SRAM cell. In this example, the non-volatile NAND strings are implemented on a first device layer 102, and each now includes a pair of storage devices. The NAND string coupled to the V1 internal node includes storage devices 352, 354, while the NAND string coupled to the V2 internal node includes storage devices 356, 358. The cross-coupled devices 122, 124 are now disposed on a second device layer 104, the word line access devices are now disposed on a third device layer 106, and the load devices 132, 134 disposed on a fourth device layer 108. The device layer 102 may represent a substrate device layer, although such is not necessarily required, as the entire memory cell, including all four device layers, may be implemented above a semiconductor substrate.

Figure 8:
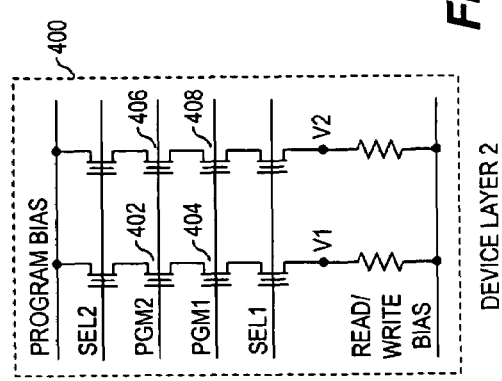
FIG. 8 depicts an exemplary layout arrangement of one device layer for a memory cell which includes two programmable data bits.

FIG. 8 depicts an exemplary layout arrangement of one device layer for a memory cell having two device layers, such as that depicted in FIG. 2, but which also includes two programmable non-volatile data bits for each memory cell. The NAND string coupled to the V1 internal node includes storage devices 402, 404, while the NAND string coupled to the V2 internal node includes storage devices 406, 408. The cross-coupled devices 122, 124 and the word line access devices remain disposed on the first device layer 102, and the load devices 132, 134 remain disposed on the second device layer 400 with the pair of NAND strings.

The above embodiments describe programmable and erasable non-volatile storage devices for each memory cell, so that each memory cell may be erased and new data stored. However, in certain embodiments, a one-time-programmable (OTP) memory cell is provided. This provides for a "default" memory data state which can be programmed and then subsequently recalled into the volatile cell, but which can be overwritten. Both the writing and reading of such data can be very high performance, because only the SRAM cell is accessed, and the non-volatile cell need not be even accessed at all.

The various embodiments described above may show NAND string select devices (also sometimes referred to as "block select" devices) as including a charge storage dielectric, such as a SONOS transistor, and thus being programmable devices like the data storage devices themselves (i.e., the NAND string "memory cell" devices). Operation of such a NAND string is described in the aforementioned "Programmable Memory Array Structure Incorporating Series-Connected Transistor Strings and Methods for Fabrication and Operation of Same", U.S. application Ser. No. 10/335, 078 filed Dec. 31, 2002, and in the aforementioned "NAND Memory Array Incorporating Capacitance Boosting of Channel Regions in Unselected Memory Cells and Method for Operation of Same", U.S. Patent Application Publication No. US 2004/0145024. By implementing all the devices in the NAND string as identical programmable devices, a mask step and certain other processing steps may be eliminated. However, such NAND strings in any of the embodiments shown or described herein may also be implemented with non-programmable select devices.

Many of the embodiments described herein may show the cross-coupled transistors as being disposed on a device layer below the non-volatile device layer (i.e., the "NV device layer"), and further may also show such cross-coupled transistors as being disposed on a semiconductor substrate device layer. Neither is necessarily required. As used herein, a device layer could include a substrate or other stacked layer suitable for forming devices such as transistors and resistors; may include wiring layers associated with the device layer, such as a local wiring for cross-coupling a pair of transistors. Examples of such device layers include thin film semiconductor layers, whether polycrystalline, amorphous, or crystalline in structure.

While the descriptions herein of various memory cells refer to structures as being above or below another structure, it is not necessarily required that such structures lie precisely above or below one another without any overlap or overhang. For example, the non-volatile devices for a particular memory cell may actually overlap the cross-coupled devices of a neighboring memory cell disposed on a lower device layer. Nonetheless, such non-volatile devices may be described as being above the cross-coupled devices for a given memory cell.

One or more of the select devices in embodiments described herein may be biased at times with a negative gate-to-source voltage. This puts a partial erase bias on such a block select device. If these block select devices are formed by the same process steps as a programmable cell, such as a depletion mode SONOS cell, these block select devices can get partially "erased" by this bias voltage applied during programming of a selected memory cell, which would slowly decrease the $V_T$ of the block select devices into a negative region after a number of program cycles. Such a threshold voltage may prevent the block select device from being turned off.

In some embodiments one could use extra processing to remove the charge storage dielectric layer (e.g., nitride) from the block select devices, or to fabricate another type of select device different than the memory cell device, but this adds additional complexity to the semiconductor process. Alternatively, a post-programming biasing condition is preferably added at the end of each program cycle, where the affected block select device is "programmed" a small amount to bring its $V_T$ back up to its maximum of, for example, about 0 volts. This may be accomplished by returning the PGM lines in a selected block back to ground (0 volts), taking the program bias nodes (and the V1 and V2 nodes) to ground, and driving the respective select signal to the programming voltage for a short time. For convenience, all the select signals may be driven to the programming voltage as there is little concern for over-programming the threshold of the block select devices. For an exemplary SONOS process, the erase time is much longer than the programming time, so that even a relatively short (e.g., 1 µs) "block select $V_T$ adjust program time" is adequate to ensure that its $V_T$ stays at its maximum.

An exemplary integrated circuit including memory cells as described here includes a row circuits block whose outputs are connected to respective bias lines, select lines, and program lines of the memory array. The row circuits block receives a group of row address signals and various control signals, and typically may include such circuits as row decoders and array terminal drivers for both read and write (i.e., programming) operations. The exemplary integrated circuit also includes a column circuits block whose input/outputs are connected to respective bit lines of the memory array. The column circuits block receives a group of column address signals, various control signals, and typically may include such circuits as column decoders, array terminal receivers, read/write circuitry, and I/O multiplexers. Circuits such as the row circuits block and the column circuits block may be collectively termed array terminal circuits for their connection to the various terminals of the memory array.

While any of a variety of semiconductor processes may be advantageously utilized to fabricate memory arrays having NAND strings, many embodiments described above contemplate memory cells formed as thin film transistors above a semiconductor substrate. Preferred methods for fabricating such memory arrays are described in: U.S. application Ser. No. 10/334,649 filed on Dec. 31, 2002, by Andrew J. Walker, et al., entitled "Formation of Thin Channels for TFT Devices to Ensure Low Variability of Threshold Voltages," which application is hereby incorporated by reference; U.S. application Ser. No. 10/079,472 filed on Feb. 19, 2002, by Maitreyee Mahajani, et al., entitled "Gate Dielectric Structures for Integrated Circuits and Methods for Making and Using Such Gate Dielectric Structures," which application is hereby incorporated by reference; U.S. application Ser. No. 10/335,089 by Andrew J. Walker, et al, entitled "Method for Fabricating Programmable Memory Array Structures Incorporating Series-Connected Transistor Strings," filed on Dec. 31, 2002, which application is hereby incorporated by reference in its entirety; U.S. application Ser. No. 10/668,693 by Maitreyee Mahajani, et al, entitled "Storage Layer Optimization of a Non Volatile Memory Device," filed on Sep. 23, 2003, which application is hereby incorporated by reference in its entirety; U.S. patent application Ser. No. 10/728,437 by James M. Cleeves, et al., entitled "Optimization of Critical Dimensions and Pitch of Patterned Features In and Above a Substrate," filed on Dec. 5, 2003, which application is hereby incorporated by reference in its entirety; and U.S. patent application Ser. No. 10/728,436, by Yung-Tin Chen, entitled "Photomask Features with Interior Nonprinting Window Using Alternating Phase Shifting," filed on Dec. 5, 2003, which application is hereby incorporated by reference in its entirety.

As used herein, a series-connected NAND string includes a plurality of devices connected in series and sharing source/drain diffusions between adjacent devices. The substrate may either be a monocrystalline substrate, such as might include support circuitry for the memory array, or may be another type of substrate, which need not necessarily include support circuitry for the memory array. For example, certain embodiments of the invention may be implemented utilizing a silicon-on-insulator (SOI) structure, and others utilizing a silicon-on-sapphire (SOS) structure. The device layers may be formed above a substrate including support circuitry for the memory array. As used herein, an integrated circuit having a three-dimensional memory array is assumed to be a monolithic integrated circuit, rather than an assembly of more than one monolithic integrated circuit packaged together or in close proximity, or die-bonded together.

Integrated circuits incorporating a memory array usually subdivide the array into a sometimes large number of smaller arrays, also sometimes known as sub-arrays. As used herein, a sub-array is a contiguous group of memory cells having contiguous word and bit lines generally unbroken by decoders, drivers, sense amplifiers, and input/output circuits. An integrated circuit including a memory array may have one or more sub-arrays.

The present invention is believed to be applicable to shadow RAM memory cells having, for certain embodiments, series-connected NAND strings which utilize modifiable conductance switch devices as memory cells, and is not to be limited to memory cells incorporating a charge storage dielectric. Such modifiable conductance switch devices are three-terminal devices whose conductance between two of the terminals is modifiable, and further is "switched" or controlled by a signal on the third or control terminal, which is generally connected to the PGM lines (or to the block select lines, for some embodiments). The conductance may be modified post-manufacture (i.e., by programming using a tunneling current; by programming using a hot electron current, etc). The modifiable conductance frequently is manifested as a modifiable threshold voltage, but may be manifested as a modifiable transconductance for some technologies.

Another exemplary memory array may implement NAND strings of "polarizable dielectric devices" such as Ferroelectric devices, where the device characteristics are modified by applying a voltage on the gate electrode which changes the polarization state of the Ferroelectric gate material. Another exemplary memory array may implement NAND strings of programmable devices utilizing a floating gate, where the device characteristics are modified by applying a voltage on a control gate electrode which causes charge to be stored onto the floating gate, thereby changing the effective threshold voltage of the device. Yet another exemplary memory array may implement NAND strings of so-called "single electron" devices or "coulomb blockade" devices, where applied voltages on the word line change the state of electron traps formed by silicon nanoparticles or any quantum well structure in the channel region by which the conduction characteristics of the NAND string devices are changed. In some embodiments, the structure of the charge storage region of the NAND string devices could also be located in a nanometer sized (i.e., from 0.1 to 10 nanometers) silicon filament formed at the source or drain edges of the gate structure to modify the device characteristic. Other alternative embodiments may utilize an organic conducting layer for the channel region and form organic material devices in a NAND string whose conductive state is selectively changed by applying an appropriate voltage to the "word lines" (i.e., here the PGM lines).

Thus, while the embodiments described in detail above utilize charge storage dielectric such as an ONO stack, other memory cells such as a floating gate EEPROM programmed threshold devices, polarizable dielectric devices, single electron or coulomb blockade devices, silicon filament charge storage devices, and organic material devices are also contemplated.

As used herein, a passive element memory cell is a 2-terminal memory cells which has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an anti-fuse technology. A passive element memory cell is not necessarily a one-time programmable (i.e., write once) memory cell.

Such passive element memory cells may generally be viewed as having a current steering element directing current in a direction and another component which is capable of changing its state (e.g., a fuse, an antifuse, a capacitor, a resistive element, etc.).

In various embodiments of the invention described herein, other non-volatile memory cell technologies are also contemplated for use with such a shadow RAM. Suitable anti-fuse memory cell structures, configurations, and processes include, without limitation, those described in: U.S. Pat. No. 6,034,882 to Johnson, et al, entitled "Vertically Stacked Field Programmable Nonvolatile Memory and Method of Fabrication"; U.S. Pat. No. 6,420,215 to Knall, et al, entitled "Three-Dimensional Memory Array and Method of Fabrication"; U.S. Pat. No. 6,525,953 to Johnson, entitled "Vertically-Stacked, Field Programmable Nonvolatile Memory and Method of Fabrication"; U.S. Patent Application Publication No. 2004-0002184 A1, by Cleeves, entitled "Three Dimensional Memory"; and U.S. patent application Ser. No. 10/326,470 by Herner, et al, filed Dec. 19, 2002, entitled "An Improved Method for Making a High Density-Nonvolatile Memory". Each of these enumerated disclosures is incorporated herein by reference in its entirety.

Other types of memory cells, such as MRAM and organic passive element cells, can also be used. MRAM (magnetoresistive random access memory) is based on magnetic memory elements, such as a magnetic tunnel junction (MTJ). MRAM technology is described in "A 256 kb 3.0V lTlMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement. Certain passive element memory cells may be used which incorporate layers of organic materials including at least one layer that has a diode-like characteristic conduction and at least one organic material that changes conductivity with the application of an electric field. U.S. Pat. No. 6,055,180 to Gudensen et al. describes such organic passive element arrays. Memory cells comprising materials such as phase-change materials and amorphous solids can also be used. See U.S. Pat. No. 5,751,012 to Wolstenholme et al., and U.S. Pat. No. 4,646,266 to Ovshinsky et al., both of which are hereby incorporated by reference. Moreover, other memory array configurations having extremely dense X-line and/or Y-line pitch requirements are also contemplated such as, for example, those incorporating thin-film transistor (TFT) EEPROM memory cells, as described in "Dense Arrays and Charge Storage Devices, and Methods for Making Same," by Thomas H. Lee, et al., U.S. Patent Application Publication No. US 2002-0028541 A1, and for those incorporating TFT NAND memory arrays, as described in "Programmable Memory Array Structure Incorporating Series-Connected Transistor Strings and Methods for Fabrication and Operation of Same" by Scheuerlein, et al., U.S. Patent Application Publication No. US 2004-0125629 A1, which applications are hereby incorporated by reference.

In many of the embodiments described above, the block select devices are formed using the same process flow as the memory cell devices to reduce the number of process steps and device structures fabricated at each memory level. Thus the block select devices are formed having the same structure as the memory cells, although they may be sized differently. As used herein, such block select devices may be considered to be structurally substantially identical to the memory cell devices, even though the respective threshold voltages may be programmed or erased to different values.

Suitable row and column circuits are set forth in "Multi-Headed Decoder Structure Utilizing Memory Array Line Driver with Dual Purpose Driver Device," U.S. patent application Ser. No. 10/306,887, filed Nov. 27, 2002; in "Tree Decoder Structure Particularly Well Suited to Interfacing Array Lines Having Extremely Small Layout Pitch," U.S. patent application Ser. No. 10/306,888, filed Nov. 27, 2002; in "Apparatus and Method for Hierarchical Decoding of Dense Memory Arrays Using Multiple Levels of Multiple-Headed Decoders," by Luca G. Fasoli and Kenneth K. So, U.S. application Ser. No. 11/026,470 filed on Dec. 30, 2004; and in "Dual-Mode Decoder Circuit, Integrated Circuit Memory Array Incorporating Same, and Related Methods of Operation" by Kenneth K. So, Luca G. Fasoli and Roy E. Scheuerlein, U.S. application Ser. No. 11/026,493 filed on Dec. 30, 2004, which applications are hereby incorporated by reference in their entirety.

As used herein, a "block select device" and a "select device" are used interchangeably, and consequently a "block select signal" and a "select signal" are also used interchangeably. As used herein, "coupled" may be used to indicate either directly coupled (i.e., no intervening nodes, devices, or structures) or indirectly coupled.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing description has described only a few of the many possible implementations of the present invention. For this reason, this detailed description is intended by way of illustration, and not by way of limitation. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A memory cell comprising:
   a pair of cross-coupled devices disposed on a first device layer and defining a pair of internal cross-coupled nodes; and
   a pair of non-volatile storage devices disposed on a second device layer above or below the pair of cross-coupled devices and coupled to the cross-coupled nodes;
   wherein the non-volatile storage devices comprise modifiable conductance switch devices, each disposed within a respective NAND string.

2. The memory cell as recited in claim 1 wherein the non-volatile storage devices comprise a charge storage dielectric.

3. The memory cell as recited in claim 1 wherein the non-volatile storage devices comprise a floating gate.

4. The memory cell as recited in claim 1 further comprising:
   a pair of word line access devices disposed on the first device layer and respectively coupling the pair of cross-coupled internal nodes to a pair of bit lines; and
   a pair of load devices formed on the second device layer, said pair of load devices respectively coupled to the pair of cross-coupled internal nodes.

5. The memory cell as recited in claim 4 wherein:
   said pair of load devices comprise semiconductor thin film resistors; and
   said pair of non-volatile devices comprises thin film devices having a charge storage dielectric and each arranged within a respective NAND string.

6. The memory cell as recited in claim 5 wherein:
   each NAND string includes one of said pair of non-volatile devices disposed between a respective group of one or more select devices at each end of said NAND string.

7. The memory cell as recited in claim 6 wherein:
   at least one of said groups of one or more select devices numbers at least two such devices in senes.

8. An integrated circuit including a memory array of memory cells, each memory cell as recited in claim 1.

9. A computer readable medium encoding a memory cell as recited in claim 1.

10. A memory cell comprising:
    a pair of cross-coupled devices disposed on a first device layer and defining a pair of internal cross-coupled nodes;
    a pair of non-volatile storage devices disposed on a second device layer above or below the pair of cross-coupled devices and coupled to the cross-coupled nodes; and a second pair of non-volatile storage devices disposed on a device layer other than the first device layer and coupled to the cross-coupled nodes.

11. The memory cell as recited in claim 10 wherein: the second pair of non-volatile storage devices are disposed on a device layer other than the second device layer.

12. The memory cell as recited in claim 11 wherein: the second pair of non-volatile storage devices are disposed on a third device layer; the memory cell further comprises a first pair of NAND strings on the second device layer, each including a respective non-volatile storage device from the first pair of such devices; and the memory cell further comprises a second pair of NAND strings on the third device layer, each including a respective non-volatile storage device from the second pair of such devices.

13. The memory cell as recited in claim 10 wherein: the second pair of non-volatile storage devices are disposed on the second device layer; and the memory cell further comprises a pair of NAND strings, each including a respective non-volatile storage device from each of the first and second pair of such devices.

14. An integrated circuit including a memory array of memory cells, each memory cell as recited in claim 10.

15. A computer readable medium encoding a memory cell as recited in claim 10.

16. A memory cell comprising:
a pair of cross-coupled devices disposed on a first device layer and defining a pair of internal cross-coupled nodes:
a pair of non-volatile storage devices disposed on a second device layer above or below the pair of cross-coupled devices and coupled to the cross-coupled nodes: and
a pair of word line access devices disposed on a third device layer, said pair of word line access devices respectively coupling the pair of cross-coupled internal nodes to a pair of bit lines.

17. The memory cell as recited in claim 16 further comprising:
a pair of load devices formed on a fourth device layer, said pair of load devices respectively coupled to the pair of cross-coupled internal nodes.

18. The memory cell as recited in claim 17 further comprising:
a pair of zias forming a portion of the cross-coupled nodes and respectively coupling together the pair of load devices, the pair of non-volatile devices, the pair of word line access devices, and the pair of cross-coupled devices.

19. The memory cell as recited in claim 17 wherein: the first device layer comprises a semiconductor substrate layer;
the pair of non-volatile storage device comprises a pair of TFT devices having a charge storage dielectric and arranged within a respective NAND string; and
the pair of load devices comprise semiconductor thin film resistors.

20. An integrated circuit including a memory array of memory cells, each memory cell as recited in claim 16.

21. A computer readable medium encoding a memory cell as recited in claim 16.

22. A memory cell comprising:
a pair of cross-coupled devices disposed on a first device layer and defining a pair of internal cross-coupled nodes;
a pair of non-volatile storage devices disposed on a second device layer above or below the pair of cross-coupled devices and coupled to the cross-coupled nodes; and
a pair of load devices formed on a device layer other than the first device layer, said pair of load devices respectively coupled to the pair of cross-coupled internal nodes.

23. The memory cell as recited in claim 22 wherein the non-volatile storage devices comprise modifiable conductance switch devices, each disposed within a respective NAND string.

24. The memory cell as recited in claim 22 wherein the non-volatile storage devices comprise one-time-programmable devices.

25. The memory cell as recited in claim 22 wherein the non-volatile storage devices comprise antifuse devices.

26. The memory cell as recited in claim 22 wherein: the pair of load devices comprise semiconductor thin film resistors.

27. The memory cell as recited in claim 22 wherein: the pair of load devices comprise a second pair of cross-coupled transistors which are complementary to the first pair of cross-coupled transistors.

28. The memory cell as recited in claim 22 wherein the pair of non-volatile storage device comprises a pair of passive element memory cell devices.

29. An integrated circuit including a memory array of memory cells, each memory cell as recited in claim 22.

30. A computer readable medium encoding a memory cell as recited in claim 22.

31. A method for operating a memory comprising:
writing data to a memory cell, said memory cell comprising a pair of cross-coupled devices disposed on a first device layer and defining a pair of internal cross-coupled nodes;
storing data written into the memory cell into a pair of non-volatile storage devices disposed on second device layer above or below the pair of cross-coupled devices and coupled to the cross-coupled nodes;
recalling data from the pair of non-volatile storage devices into the memory cell; and
reading the memory cell while decoupling the pair of non-volatile storage devices from the memory cell.

32. A shadow RAM memory cell comprising:
an SRAM memory cell including at least a pair of cross-coupled transistors disposed on a first device layer and defining a pair of internal cross-coupled nodes, and further including a pair of access transistors; and
non-volatile storage means disposed at least partially on a second device layer above or below the pair of cross-coupled devices, and coupled to the cross-coupled internal nodes for storing at least two separate bits of information, either of which may be recalled into the SRAM memory cell.

* * * * *

UNITED STATES PATENT AND TRADEMARK OFFICE
CERTIFICATE OF CORRECTION

PATENT NO. : 7,280,397 B2 Page 1 of 1
APPLICATION NO. : 11/179360
DATED : October 9, 2007
INVENTOR(S) : Roy E. Scheuerlein It is certified that error appears in the above-identified patent and that said Letters Patent is hereby corrected as shown below:

Col. 16, line 55, (Claim 7) please replace "senes." with --series.--
Col. 17, line 57, (Claim 19) please replace "device" with --devices--
Col. 18, line 31, (Claim 28) please replace "device" with --devices--

Signed and Sealed this

Twenty-seventh Day of May, 2008

JON W. DUDAS
*Director of the United States Patent and Trademark Office*